(12) United States Patent
Todoko et al.

(10) Patent No.: US 8,828,198 B2
(45) Date of Patent: Sep. 9, 2014

(54) CYLINDRICAL SPUTTERING TARGET

(75) Inventors: Shigehisa Todoko, Tokyo (JP); Kenichi Itoh, Kanagawa (JP); Tetsuo Shibutami, Kanagawa (JP)

(73) Assignee: Tosoh Corporation, Yamaguchi (JP)

( * ) Notice: Subject to any disclaimer, the term of this patent is extended or adjusted under 35 U.S.C. 154(b) by 962 days.

(21) Appl. No.: 12/667,151

(22) PCT Filed: Jul. 1, 2008

(86) PCT No.: PCT/JP2008/061923
§ 371 (c)(1),
(2), (4) Date: Dec. 29, 2009

(87) PCT Pub. No.: WO2009/005068
PCT Pub. Date: Jan. 8, 2009

(65) Prior Publication Data
US 2010/0326823 A1    Dec. 30, 2010

(30) Foreign Application Priority Data
Jul. 2, 2007    (JP) ................................ 2007-173841

(51) Int. Cl.
*C23C 14/34*    (2006.01)
(52) U.S. Cl.
CPC ......... *C23C 14/3407* (2013.01); *C23C 14/3414* (2013.01)
USPC ............................... 204/298.21; 204/298.12
(58) Field of Classification Search
CPC ..................... C23C 14/3414; C23C 14/3407
USPC ............. 204/298.12, 298.13, 298.21, 298.22
See application file for complete search history.

(56) References Cited

U.S. PATENT DOCUMENTS

| | | | |
|---|---|---|---|
| 3,884,793 A * | 5/1975 | Penfold et al. ........... 204/298.16 |
| 6,464,847 B1 | 10/2002 | Kumahara et al. |
| 6,787,011 B2 | 9/2004 | Ueda et al. |
| 2003/0136662 A1 | 7/2003 | Ueda et al. |
| 2006/0151321 A1 | 7/2006 | Itoh et al. |

FOREIGN PATENT DOCUMENTS

CN    1452668    10/2003
(Continued)

OTHER PUBLICATIONS

Translation to Shinno (JP 63-216661) published Sep. 1988.*

(Continued)

*Primary Examiner* — John Brayton
(74) *Attorney, Agent, or Firm* — Greenblum & Bernstein, P.L.C.

(57) ABSTRACT

To provide a cylindrical sputtering target, whereby cracking during sputtering can be remarkably reduced.
A cylindrical sputtering target, wherein a cylindrical target material made of ITO or AZO has a relative density of at least 90%; the angle between the grinding direction on its outer circumferential surface and a straight line parallel with its cylindrical axis (out of such angles, $\theta$ represents an angle between 0° and 90°) satisfies $45° < \theta \leq 90°$ or $\tan \theta > \pi R/L$ (where R is an outside diameter of the cylindrical target material, and L is the length of the cylindrical target material); and the surface roughness Ra of the outer circumferential surface of the cylindrical target material is at most 3 μm.

10 Claims, 2 Drawing Sheets

(56) References Cited

FOREIGN PATENT DOCUMENTS

| JP | 58-500174 | | | 2/1983 |
|---|---|---|---|---|
| JP | 63216661 | A | * | 9/1988 |
| JP | 08-060352 | | | 3/1996 |
| JP | 2000117599 | A | * | 4/2000 |
| JP | 2001-026863 | | | 1/2001 |
| JP | 2001-131737 | | | 5/2001 |
| JP | 2003-055763 | | | 2/2003 |
| JP | 3628554 | | | 12/2004 |
| JP | 2005-281862 | | | 10/2005 |
| WO | 01/06029 | | | 1/2001 |

OTHER PUBLICATIONS

Translation to Kikuchi (JP 2000-117599) published Apr. 2000.*
Striation (n), Meriam Webster Online Dictionary retrieved Oct. 9, 2013.*
International Preliminary Report on Patentability, including the Written Opinion (in English) for PCT/JP2008/061923, mailed Feb. 4, 2010.
Taiwanese Office Action in counterpart application No. 097124939, dated Jul. 10, 2013.

* cited by examiner

CYLINDRICAL SPUTTERING TARGET

TECHNICAL FIELD

The present invention relates to a cylindrical sputtering target to be used for e.g. a magnetron rotary cathode sputtering apparatus.

BACKGROUND ART

A magnetron rotary cathode sputtering apparatus has a magnetic field-generating device on the inside of a cylindrical sputtering target and is designed to carry out sputtering while cooling from the inside of the target and rotating the target, and the entire surface of the target material undergoes erosion and is uniformly shaved off, whereby it is possible to obtain a remarkably high target utilization ratio (at least 60%) as compared with the utilization ratio (from 20 to 30%) of a conventional planar magnetron sputtering apparatus. Further, by rotating the target, it is possible to input a large power per unit area as compared with a conventional planar magnetron sputtering apparatus, whereby a high film deposition rate can be obtained (Patent Document 1).

As the target material for the cylindrical target to be used for the magnetron rotary cathode sputtering apparatus, a metal material is mainly used. As a ceramic material, it is strongly desired to develop e.g. ITO (indium tin oxide) or AZO (aluminum zinc oxide), but such a development has not been practically successful. One reason is "cracking" of the cylindrical target material attributable to the difference in the thermal expansion between the cylindrical target material and the cylindrical backing tube during sputtering. This is attributable to the fact that the thermal expansion coefficient of the ceramic material is usually smaller than the thermal expansion coefficient of a metal to be used as the material for the cylindrical backing tube. Once cracking takes place, particles may be formed and may adversely affect the quality of the film, or the film deposition is obliged to be stopped.

With respect to a planar target, Patent Document 2 discloses a technique with respect to the relation between cracking caused by a difference in the thermal expansion and the grinding direction on the target material. Patent Document 2 discloses that the cracking can be prevented by carrying out grinding in a direction parallel with the longitudinal direction of the planar target material (i.e. the direction in which the difference in the expansion between the planar target material and the planar substrate becomes large).

Patent Document 1: JP-A-58-500174
Patent Document 2: Japanese Patent No. 3,628,554

DISCLOSURE OF THE INVENTION

Object to be Accomplished by the Invention

It is an object of the present invention to provide a cylindrical sputtering target whereby cracking during sputtering can remarkably be reduced.

Means to Accomplish the Object

The present inventors have conducted an extensive study to accomplish the above object and as a result, have found the following.

That is, there are two types of stress caused by a difference in thermal expansion, which a cylindrical target material will receive, i.e. a stress in a direction parallel with the cylindrical axis in which the difference in expansion between the target material and the backing tube becomes large, and a stress in a direction perpendicular to the cylindrical axis. For example, in a case where a cylindrical ITO target material having an outside diameter of 150 mm and a length of 2.5 m is bonded to a cylindrical backing tube made of SUS 304, when the expansion of the cylindrical target material and the cylindrical backing tube during the use is compared, the expansion in a direction parallel with the cylindrical axis is larger by about 17 times than the expansion in a direction perpendicular to the cylindrical axis. However, the present inventors have found that the stress in a direction perpendicular to the cylindrical axis is more influential over the cracking than the stress in a direction parallel with the cylindrical axis, and the present invention has been accomplished on the basis of this discovery.

That is, the present invention provides a cylindrical sputtering target comprising a cylindrical target material made of a ceramic material, characterized in that the angle $\theta_1$ between the grinding direction on the outer circumferential surface of the cylindrical target material and a straight line parallel with the cylindrical axis (out of such angles, $\theta_1$ represents an angle between 0° and 90°) satisfies $45° < \theta_1 \leq 90°$, and the surface roughness Ra of the outer circumferential surface of the cylindrical target material is at most 3 μm.

Further, the present invention provides a cylindrical sputtering target comprising a cylindrical target material made of a ceramic material, characterized in that the angle $\theta_2$ between the grinding direction on the outer circumferential surface of the cylindrical target material and a straight line parallel with the cylindrical axis (out of such angles, $\theta_2$ represents an angle between 0° and 90°) satisfies $\tan \theta_2 > \pi R/L$ (where R is an outside diameter of the cylindrical target material, and L is the length of the cylindrical target material), and the surface roughness Ra of the outer circumferential surface of the cylindrical target material is at most 3 μm.

As the cylindrical target material to be used for the cylindrical sputtering target of the present invention, various ceramic materials may be used. For example, an oxide containing, as the main component, at least one member selected from the group consisting of In, Sn, Zn, Al, Ta, Nb and Ti, may be mentioned. More specifically, ITO (indium tin oxide), AZO (aluminum zinc oxide), IZO (indium zinc oxide), $Ta_2O_5$, $Nb_2O_5$, $TiO_2$ or the like may, for example, be mentioned. Among them, ITO or AZO is preferred.

Further, the relative density of the cylindrical target material made of ITO or AZO is preferably at least 90%.

Effects of the Invention

According to the present invention, it is possible to provide a cylindrical sputtering target whereby cracking during sputtering can remarkably be reduced.

MEANINGS OF SYMBOLS

Figure 1:
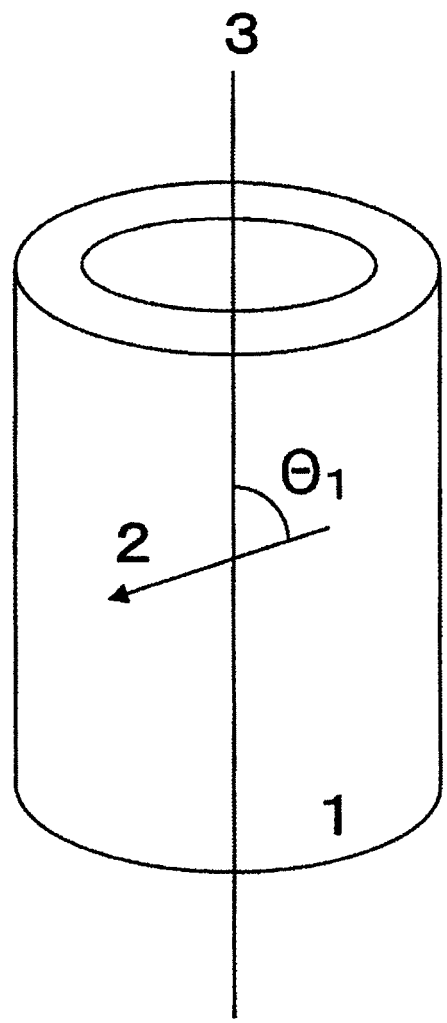
FIG. 1 is a view illustrating the grinding direction according to a first embodiment of the present invention.

1: Cylindrical target material
2: Grinding direction
3: Straight line parallel with the cylindrical axis
4: Cylindrical target material
5: Grinding direction 6: Straight line parallel with the cylindrical axis
7: Outside diameter R of the cylindrical target material
8: Length L of the cylindrical target material

BEST MODE FOR CARRYING OUT THE INVENTION

Now, the present invention will be described in detail.

As the cylindrical target material to be used for the cylindrical sputtering target of the present invention, various ceramic materials may be used. For example, an oxide containing, as the main component, at least one member selected from the group consisting of In, Sn, Zn, Al, Ta, Nb and Ti may be mentioned. More specifically, ITO (indium tin oxide), AZO (aluminum zinc oxide), IZO (indium zinc oxide), $Ta_2O_5$, $Nb_2O_5$, $TiO_2$ or the like, may, for example, be mentioned. Among them, ITO or AZO is preferred.

A blank of the cylindrical target material can be prepared by a known ceramic-production technique such as a sintering process, a HIP (hot isostatic pressing) method or a thermal spraying method. By such a technique, it is usually difficult to precisely control the size of the product, and it is necessary to carry out grinding of e.g. the outer circumferential surface, the inner circumferential surface, etc. after the production.

In the present invention, "grinding" includes "polishing" in its meaning.

In the present invention, for the grinding of the outer circumferential surface, a known grinding means may be used, such as a lathe, a cylindrical grinder, a machining center, a core drill, a sand paper or the like. For example, in a case where a lathe is used, the grinding direction may be changed by changing the rotational speed of the cylindrical target material and the feed speed of the grinding tool, whereby it is possible to adjust the grinding direction to be within the range defined in the present invention. Also in a case where other grinding means are employed, the above-described grinding method may suitably be employed.

In the present invention, "the grinding direction" is a direction of movement of the nose of the grinding tool during grinding, specifically, e.g., the direction of grinding striation formed on the surface of the cylindrical target material.

In the first embodiment of the present invention, it is necessary to carry out grinding so that, as shown in FIG. 1, the angle $\theta_1$ between the grinding direction (2) on the outer peripheral surface of the cylindrical target material (1) made of a ceramic material and a straight line (3) parallel with the cylindrical axis (out of such angles, $\theta_1$ represents an angle between 0° and 90°) satisfies $45°<\theta_1\leq90°$. That is, it is possible to remarkably reduce cracking due to a stress in a direction perpendicular to the cylindrical axis by bringing the grinding direction on the outer circumferential surface of the cylindrical target material close to the direction perpendicular to the cylindrical axis. Preferred is $85°\leq\theta_1\leq90°$, and more preferred is $89°\leq\theta_1\leq90°$. Further, by bringing the surface roughness Ra of the outer circumferential surface of the cylindrical target material to be at most 3 μm, it is possible to offset the possibility of cracking due to a stress in a direction parallel with the cylindrical axis which has relatively increased by setting the grinding direction as described above, thereby to remarkably reduce cracking as a whole.

Figure 2:
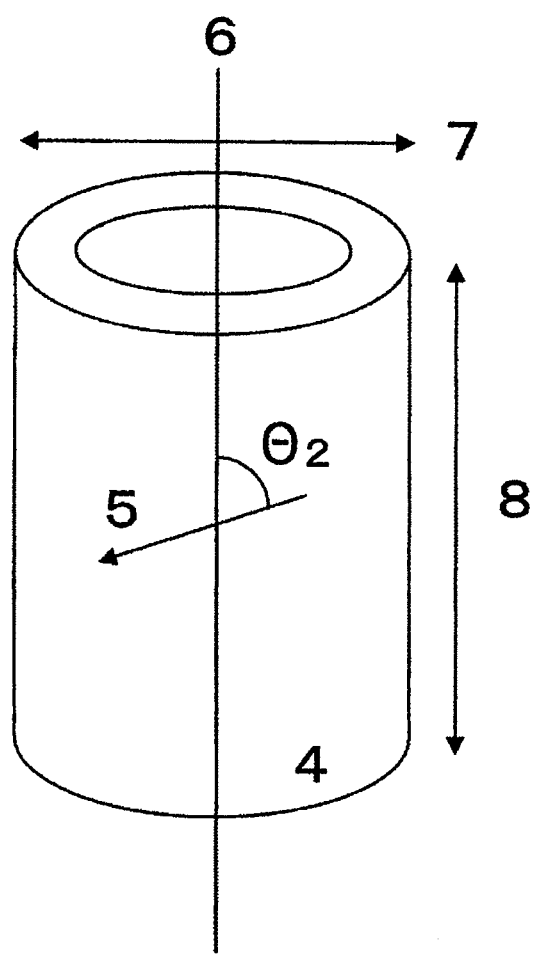
FIG. 2 is a view illustrating the grinding direction according to a second embodiment of the present invention.

Further, in the second embodiment of the present invention, it is necessary to carry out grinding so that, as shown in FIG. 2, the angle $\theta_2$ between the grinding direction (5) on the outer circumferential surface of the cylindrical target material (4) made of a ceramic material and a straight line (6) parallel with the cylindrical axis (out of such angles, $\theta_2$ represents an angle between 0° and 90°) satisfies $\tan\theta_2>\pi R/L$ (wherein R is the outside diameter (7) of the cylindrical target material, and L is the length (8) of the cylindrical target material). That is, it is possible to remarkably reduce cracking due to a stress in a direction perpendicular to the cylindrical axis by satisfying such a condition. By setting the grinding direction in such a manner, the grinding striation started from one end of the cylindrical target material will not reach the other end even when it is formed circumferentially around the cylindrical target for 360°, and consequently, it is possible to reduce the cracking. Further, by bringing the surface roughness Ra of the cylindrical target material to be at most 3 μm, it is possible to offset the possibility of cracking due to a stress in a direction parallel with the cylindrical axis which has relatively increased by setting the grinding direction as described above, thereby to remarkably reduce cracking as a whole.

In each of the first and second embodiments of the present invention, the effect to reduce cracking is observed when the surface roughness Ra of the outer circumferential surface is at most 3 μm, and the surface roughness Ra is preferably at most 1 μm, more preferably at most 0.5 μm. In the present invention, the measurement of the surface roughness Ra is carried out in a direction parallel with the cylindrical axis. With respect to other conditions, the measurement of the surface roughness Ra is in accordance with JIS B0601.

Further, in the present invention, grinding of the outer circumferential surface of the cylindrical target material may be carried out in a plurality of times. In such a case, it is necessary that the grinding direction at the time when the grinding striation finally remains on the outer circumferential surface of the cylindrical target material, be the grinding direction of the present invention.

In a case where the cylindrical target material is ITO or AZO, the effect to reduce cracking tends to be high as the relative density of the cylindrical target material becomes high. The relative density is preferably at least 90%, more preferably at least 95%, particularly preferably at least 99%.

In the present invention, the relative density can be calculated by the following formula from the theoretical density of the target material and the density measured by means of Archimedes method.

Relative density (%)=(Density measured by means of Archimedes method/theoretical density)×100

Further, in a case where the cylindrical target material is ITO, the cylindrical sputtering target may be prepared by a known technique. For example, such an ITO cylindrical target material may be obtained in such a manner that an ITO raw material is filled in a cylindrical rubber mold having a core cylinder, followed by CIP molding (cold isostastic pressing) under a pressure of at least 500 kg/cm$^2$, and the obtained molded product is fired at a temperature of from 1,450 to 1,650° C. and then subjected to processing as described above. The obtained cylindrical target material is bonded to a cylindrical backing tube by a known technique by means of a metal solder material such as In, Sn, an In alloy or an Sn alloy or a thermosetting resin, to prepare a cylindrical sputtering target. Further, also in the case of a ceramic material such as AZO, the sputtering target may be prepared in the same manner as described above.

Further, the cylindrical sputtering target obtained by the present invention is useful for a usual magnetron rotary cathode sputtering apparatus which has a magnetic field-generating device on the inside of the cylindrical sputtering target and which is designed to carry out sputtering while cooling from the inside of the target and rotating the target. The conditions under which sputtering is carried out by using the cylindrical sputtering target of the present invention, may, for example, be a rotational speed of from 5 to 30 rpm, a sputtering pressure of from 0.1 to 2 Pa and a power density of from 0.1 to 20 W/cm².

EXAMPLES

Now, the present invention will be described in further detail with reference to Examples, but it should be understood that the present invention is by no means thereby restricted.

Example 1

One cylindrical ITO target material having an outside diameter of 152 mm, an inside diameter of 128 mm, a length of 202 mm and a relative density of 99.5% as measured by Archimedes method, and one cylindrical backing tube made of SUS 304 and having an outside diameter of 128 mm, an inside diameter of 122 mm and a length of 400 mm, were prepared. The cylindrical ITO target material was processed so that the outside diameter became 150 mm, the inside diameter became 130 mm and the length became 200 mm, and at that time, the outer circumferential surface was ground by a lathe by adjusting the rotational speed of the cylindrical target material and the feed speed of the grinding tool, so that the angle $\theta_1$ or $\theta_2$ between the grinding direction on the outer circumferential surface of the cylindrical target material and a straight line parallel with the cylindrical axis finally became 89° (tan $\theta_2$=57.3>πR/L=2.4). The surface roughness Ra after the grinding was 1.2 µm. Such a cylindrical ITO target material was bonded to the cylindrical backing tube by means of an indium solder to obtain a cylindrical ITO sputtering target.

Such a cylindrical ITO sputtering target was subjected to discharge evaluation under such conditions that the rotational speed was 6 rpm, the sputtering pressure was 0.4 Pa and the power density was 2.0 W/cm². Upon expiration of 5 hours from the initiation of the discharge, the discharge was stopped, and the state of the cylindrical ITO sputtering target was inspected, whereby no cracking was observed.

Example 2

A cylindrical ITO sputtering target was prepared in the same manner as in Example 1 except that the cylindrical target material was ground by a lathe so that the angle $\theta_1$ or $\theta_2$ between the grinding direction of the outer circumferential surface of the cylindrical target material and a straight line parallel with the cylindrical axis became 90° (tan $\theta_2$=∞>πR/L=2.4), and the outer circumferential surface was further ground by a sand paper (#800) so that $\theta_1$ became 90°. The surface roughness Ra of this target was 0.1 µm. Discharge evaluation of this cylindrical ITO sputtering target was carried out in the same manner as in Example 1, whereby no cracking was observed.

Example 3

A cylindrical ITO sputtering target was prepared in the same manner as in Example 2 except that the relative density of the cylindrical target material was 90.2%. The surface roughness of this target was 0.7 µm. Discharge evaluation of this cylindrical ITO sputtering target was carried out in the same manner as in Example 1, whereby no cracking was observed.

Example 4

A cylindrical AZO sputtering target was prepared in the same manner as in Example 1, except that a cylindrical AZO target material having a relative density of 99.2% was used. The surface roughness Ra of this target was 1.3 µm. Discharge evaluation of this cylindrical AZO sputtering target was carried out in the same manner as in Example 1, whereby no cracking was observed.

Comparative Example 1

A cylindrical ITO sputtering target was prepared in the same manner as in Example 1, except that the outer circumferential surface of the cylindrical ITO target material was ground in a direction parallel with the cylindrical axis, i.e. was ground by means of a machining center so that the angle $\theta_1$ or $\theta_2$ between the grinding direction on the outer circumferential surface of the cylindrical target material and a straight line parallel with the cylindrical axis became 0° (tan $\theta_2$=0<πR/L=2.4). Discharge evaluation of this cylindrical ITO sputtering target was carried out in the same manner as in Example 1, whereby cracking took place.

Comparative Example 2

A cylindrical ITO sputtering target was prepared in the same manner as in Example 2 except that the sand paper was changed to #60. The surface roughness Ra was 3.1 µm. Discharge evaluation of this cylindrical ITO sputtering target was carried out in the same manner as in Example 1, whereby cracking took place.

Comparative Example 3

A cylindrical ITO sputtering target was prepared in the same manner as in Example 1 except that the outer circumferential surface of the cylindrical ITO target material was ground by means of a cylindrical grinder so that the angle $\theta_1$ or $\theta_2$ between the grinding direction on the outer circumferential surface of the cylindrical target material and a straight line parallel with the cylindrical axis became 90° (tan $\theta_2$=∞>πR/L=2.4), and then ground by means of a machining center so that the angle $\theta_1$ or $\theta_2$ between the grinding direction on the outer circumferential surface of the cylindrical target material and a straight line parallel with the cylindrical axis became 0° (tan $\theta_2$=0<πR/L=2.4). The grinding striation finally remained at that time was only one where the angle $\theta_1$ or $\theta_2$ between the grinding direction of the outer circumferential surface of the cylindrical target material and a straight line parallel with the cylindrical axis was 0° (tan $\theta_2$=0<πR/L=2.4). Discharge evaluation of this cylindrical ITO sputtering target was carried out in the same manner as in Example 1, whereby cracking took place.

Industrial Applicability

According to the present invention, it is possible to provide a cylindrical sputtering target, whereby various ceramics materials can be used as the cylindrical target material, and cracking during sputtering can be remarkably reduced. Thus, the present invention is industrially useful.

The entire disclosures of Japanese Patent Application No. 2007-173841 filed on Jul. 2, 2007 and Japanese Patent Application No. 2008-160376 filed on Jun. 19, 2008 including specifications, claims, drawings and summaries are incorporated herein by reference in their entireties.

The invention claimed is:
1. A cylindrical sputtering target comprising a cylindrical target material made of a ceramic material having linear grinding striation, wherein an angle $\theta_1$ between a direction of the linear grinding striation on the outer circumferential surface of the cylindrical target material and a straight line par- allel with the cylindrical axis satisfies $45°<\theta_1<90°$, and the surface roughness Ra of the outer circumferential surface of the cylindrical target material is at most 3 μm.

2. A cylindrical sputtering target comprising a cylindrical target material made of a ceramic material having linear grinding striation, wherein an angle $\theta_2$ between a direction of the linear grinding striation on the outer circumferential surface of the cylindrical target material and a straight line parallel with the cylindrical axis, wherein $\theta_2$ represents an angle between 0° and 90°, satisfies $\tan \theta_2 > \pi R/L$, wherein R is an outside diameter of the cylindrical target material, and L is a length of the cylindrical target material, and the surface roughness Ra of the outer circumferential surface of the cylindrical target material is at most 3 μm.

3. The cylindrical sputtering target according to claim 1, wherein the cylindrical target material is made of an oxide containing, as the main component, at least one member selected from the group consisting of In, Sn, Zn, Al, Ta, Nb and Ti.

4. The cylindrical sputtering target according to claim 1, wherein the cylindrical target material is made of indium tin oxide (ITO) or aluminum zinc oxide (AZO).

5. The cylindrical sputtering target according to claim 4, wherein the cylindrical target material made of ITO or AZO has a relative density of at least 90%.

6. The cylindrical sputtering target according to claim 4, wherein the cylindrical target material made of ITO or AZO has a relative density of at least 99%.

7. The cylindrical sputtering target according to claim 2, wherein the cylindrical target material is made of an oxide containing, as the main component, at least one member selected from the group consisting of In, Sn, Zn, Al, Ta, Nb and Ti.

8. The cylindrical sputtering target according to claim 2, wherein the cylindrical target material is made of indium tin oxide (ITO) or aluminum zinc oxide (AZO).

9. The cylindrical sputtering target according to claim 8, wherein the cylindrical target material made of ITO or AZO has a relative density of at least 90%.

10. The cylindrical sputtering target according to claim 8, wherein the cylindrical target material made of ITO or AZO has a relative density of at least 99%.

* * * * *